United States Patent
Huang et al.

(10) Patent No.: US 6,995,981 B2
(45) Date of Patent: Feb. 7, 2006

(54) HEAT SINK ASSEMBLY WITH COMBINED PARALLEL FINS

(75) Inventors: Aimin Huang, Shenzhen (CN); Yeu-Lih Lin, Tu-Chen (TW)

(73) Assignee: Hon Hai Precision Inc. Co., Ltd., Taipei Hsien (TW)

( * ) Notice: Subject to any disclaimer, the term of this patent is extended or adjusted under 35 U.S.C. 154(b) by 183 days.

(21) Appl. No.: 10/610,623

(22) Filed: Jun. 30, 2003

(65) Prior Publication Data

US 2004/0207984 A1 Oct. 21, 2004

(30) Foreign Application Priority Data

Apr. 18, 2003 (TW) ........................ 92206133 U

(51) Int. Cl.
*H05N 7/20* (2006.01)

(52) U.S. Cl. .................... 361/703; 165/76; 165/78; 165/80.3; 165/185; 257/722; 361/710; 361/690; 29/890.03

(58) Field of Classification Search ............ 165/80.2, 165/80.3, 185, 78, 76; 257/722, 719; 361/703–704, 361/709–710, 697, 690; 29/890.03
See application file for complete search history.

(56) References Cited

U.S. PATENT DOCUMENTS

| 6,474,407 | B1 | * | 11/2002 | Chang et al. | ............... | 165/80.3 |
| 6,639,802 | B1 | * | 10/2003 | Dong et al. | ................. | 361/709 |
| 6,729,384 | B1 | * | 5/2004 | Lo | ............................. | 165/80.3 |
| 6,789,609 | B2 | * | 9/2004 | Tsai et al. | ..................... | 165/78 |

FOREIGN PATENT DOCUMENTS

| CN | 00254564.0 | 9/2001 |
| CN | 01223334.X | 4/2002 |

* cited by examiner

*Primary Examiner*—Gregory Thompson
(74) *Attorney, Agent, or Firm*—Wei Te Chung

(57) ABSTRACT

A heat sink assembly includes a heat-conductive base (20), and a plurality of combined fins (30) uprightly attached onto the base. Each fin includes a main body (31), a bottom flange (32) extending from the main body, and two lower abutting plates (34) extending upwardly from the flange. A pair of first locking tabs (342) is formed from outer sides of the lower abutting plate, and extends into corresponding cutouts (36) of the main body of an adjacent fin. Two upper abutting plates (34') are formed from a top edge of the main body. A second locking tab (40) extends from an outer side of each upper abutting plate, and into a corresponding notch (38) of the main body of the adjacent fin. Then, the first and second locking tabs are bent inwardly to abut against the main body of the adjacent fin. Thus, the fins are firmly combined together.

13 Claims, 4 Drawing Sheets

HEAT SINK ASSEMBLY WITH COMBINED PARALLEL FINS

BACKGROUND OF THE INVENTION

1. Field of the Invention

The present invention relates to heat sink assemblies, and particularly to a heat sink assembly having high density fins, and the fins can be firmly combined together.

2. Prior art

Advances in microelectronics technology have resulted in electronic devices which process signals and data at unprecedented high speeds. During operation of many contemporary electronic devices such as central processing units (CPUs), large amounts of heat are produced. The heat must be efficiently removed, to prevent the system from becoming unstable or being damaged. Heat sinks are frequently used to dissipate heat from these electronic devices.

However, contemporary CPUs are performing tasks faster and faster and orient to be smaller and smaller in sizes, thus generating more and more heat in relative small volumes. Typical heat sinks are often integrally made by extruding aluminum. The kind of integral heat sink has a base and a plurality of spaced fins extending upwardly from the base. However, the width-to-height ratio of the heat sink is limited by the extruding process. Thus, the effective heat-dissipating area of the heat sink is restricted.

In order to overcome the extruding problem, a heat dissipating structure is provided. Each fin is separately formed and assembled onto a base. The kind of heat dissipating assembly has no limitation of width-to-height ratio of the fins. For example, China Pat. Nos. 01223334.X and 00254564.0, present combined heat sink fins (see FIGS. 4 and 5). Referring to FIG. 4, each fin 100 of China Pat. No. 01223334.X forms a plurality of tabs 110 at upper and lower sides thereof. A plurality of cutouts 120 is defined in each tab 110. The tabs 110 of each fin 100 extend into the cutouts 120 of an adjacent fin. Referring to FIG. 5, each fin 100' of China Pat. No. 00254564.0 forms two flanges at opposite ends thereof. A plurality of tabs 110' is formed at each flange. A nub 112' protrudes from each tab 110'. A plurality of cutouts 120' is defined in each flange, corresponding to the tabs 110'. The tabs 110' of each fins 100' extend into the cutouts 120' of an adjacent fin. The nub 112' of each tab 110' abuts against the adjacent fin therefore preventing the fin 100' from releasing from the adjacent fin.

However, the combined heat sink fins as shown in FIGS. 4–5 are relatively loose, because the fins are combined together only through tabs extending into cutouts. The heat sink fins combinations are easily deformed and difficult to be held during transportation or assembling process. In addition, combining points of the fins are positioned at lower and upper ends of the fins, which generates an uneven contacting surface between the fins and the heat-conductive base. The uneven contacting surface lowers the heat-conductive efficiency.

An improved heat sink assembly with combined fins, which overcomes the above-mentioned problems, is desired.

BRIEF SUMMARY OF THE INVENTION

Accordingly, an object of the present invention is to provide a heat sink assembly having high density fins which can optionally have any width-to-height ratio.

Another object of the present invention is to provide a heat sink assembly having fins which are firmly combined together.

Still another object of the present invention is to provide a heat sink assembly having high density fins, and a locking structure for assembling the fins and increasing the strength of heat sink assembly.

To achieve the above-mentioned objects, a heat sink assembly of a preferred embodiment of the present invention comprises a heat-conductive base, and a plurality of combined fins uprightly attached onto the base. Each fin includes a main body, a bottom flange extending from the main body, and two lower abutting plates extending upwardly from the flange. A pair of first locking tabs is formed from outer sides of the lower abutting plate, and extends into corresponding cutouts of the main body of an adjacent fin. Two upper abutting plates are formed from a top edge of the main body. A second locking tab extends from an outer side of each upper abutting plate, and into a corresponding notch of the main body of the adjacent fin. Then, the first and second locking tabs are bent inwardly to abut against the main body of the adjacent fin. Thus, the fins are firmly combined together.

Other objects, advantages and novel features of the present invention will be drawn from the following detailed description of preferred embodiments of the present invention with the attached drawings, in which:

DESCRIPTION OF THE PREFERRED EMBODIMENTS

Figure 1:
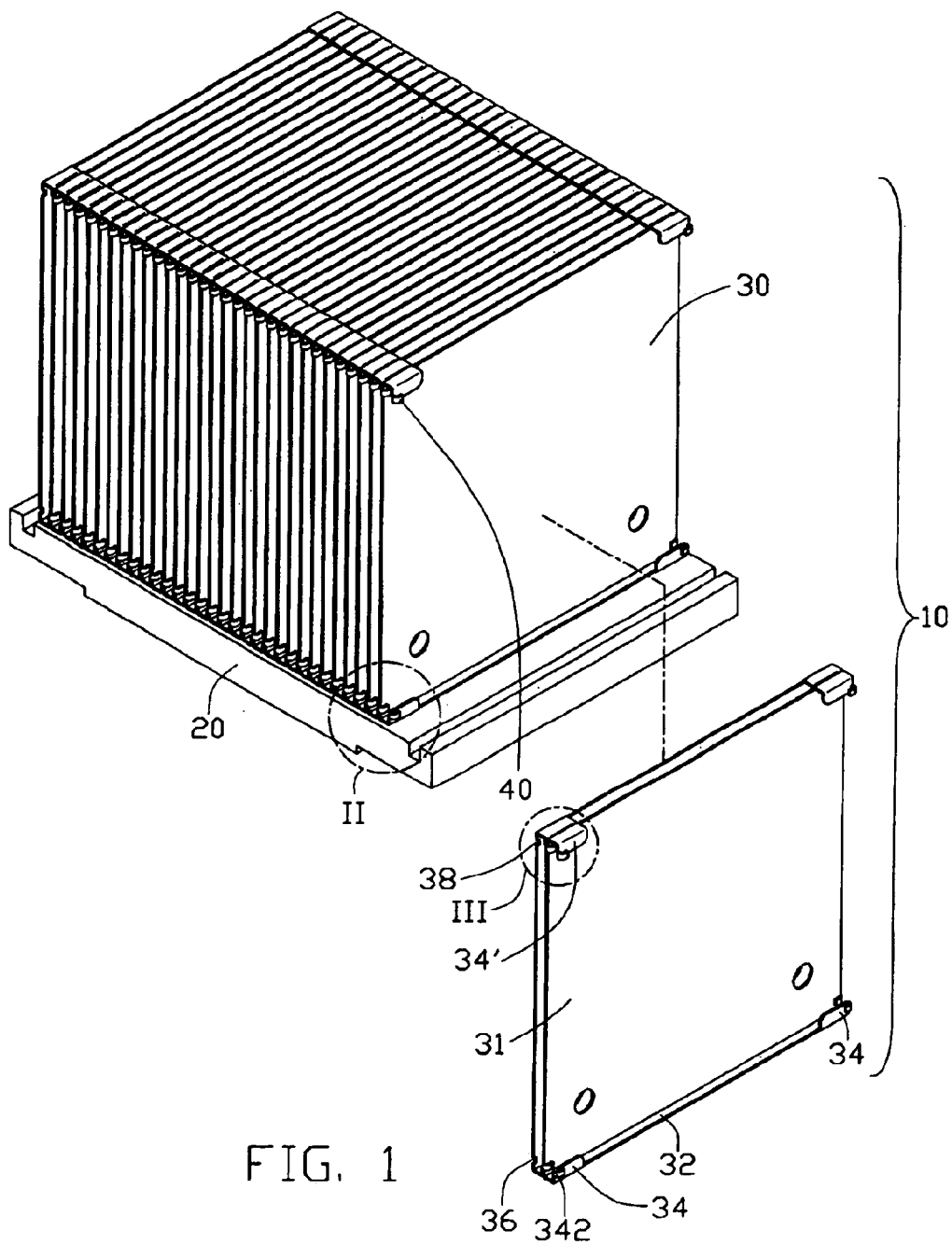
FIG. 1 is an isometric view of a heat sink assembly in accordance with a preferred embodiment of the present invention.
Figure 2:
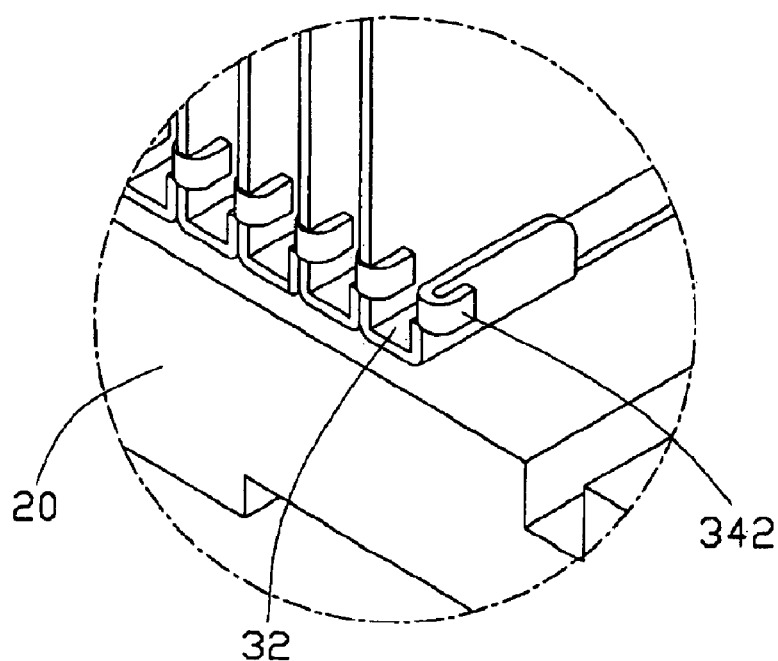
FIG. 2 is an enlarged view of the encircled portion II of FIG. 1.
Figure 3:
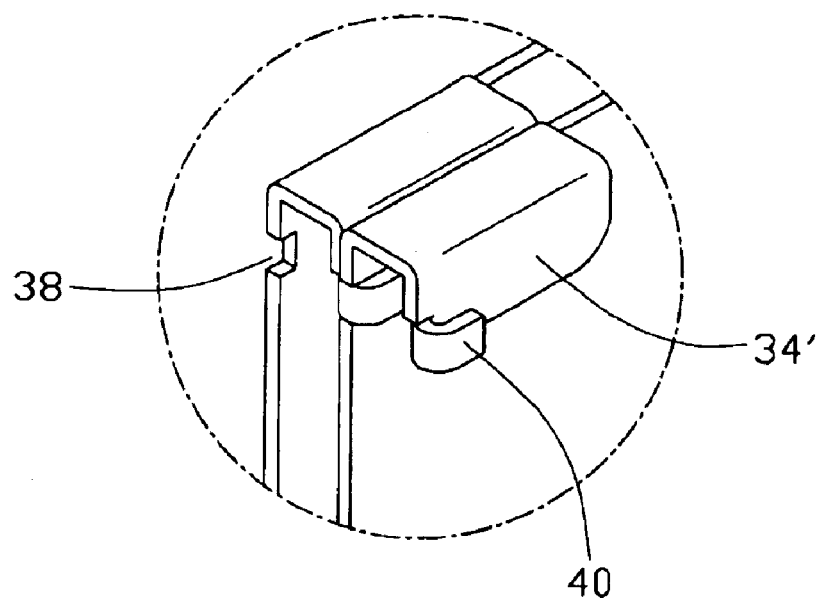
FIG. 3 is an enlarged view of the encircled portion III of FIG. 1.
Figure 4:
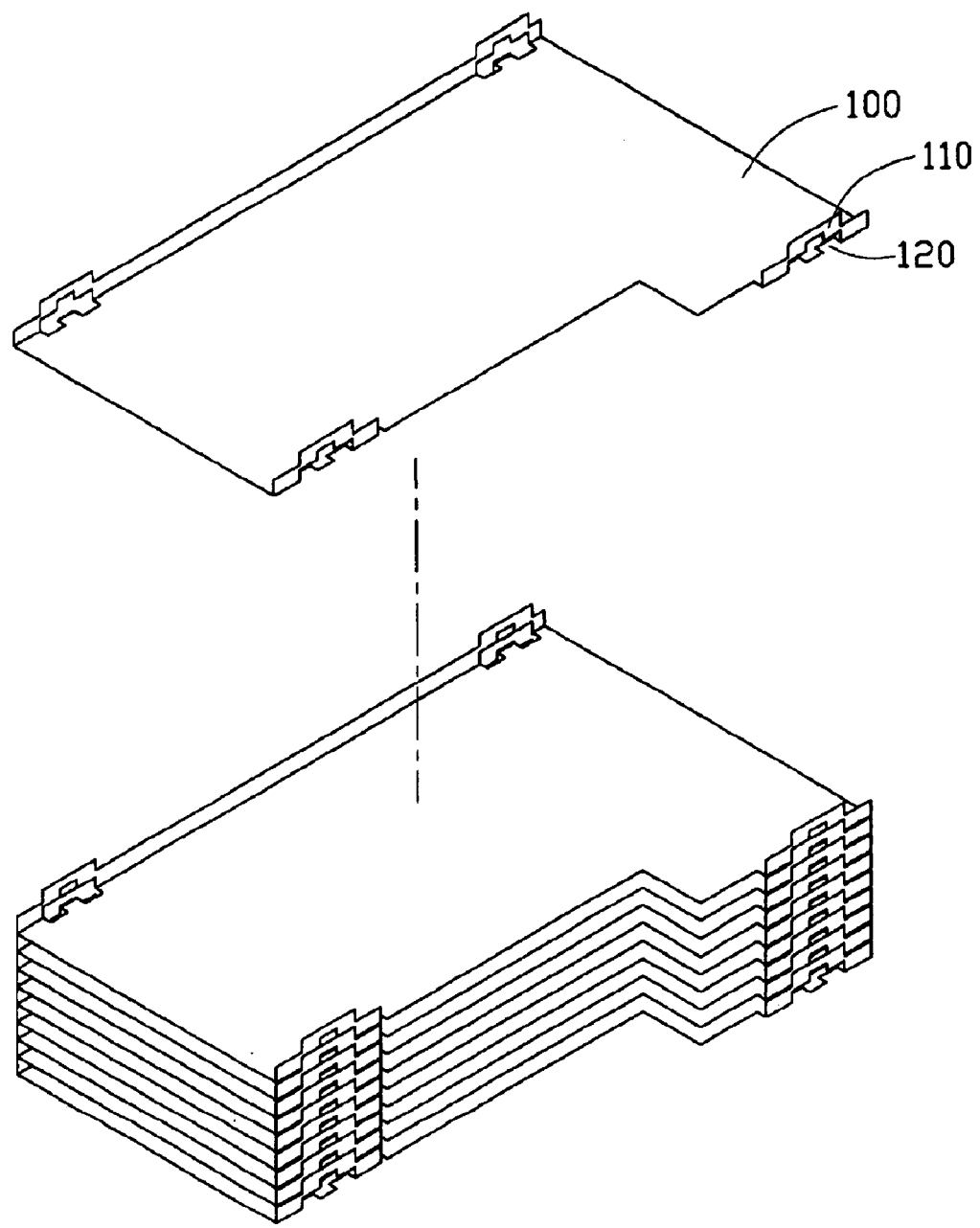
FIG. 4 is an isometric view of a conventional heat sink assembly.
Figure 5:
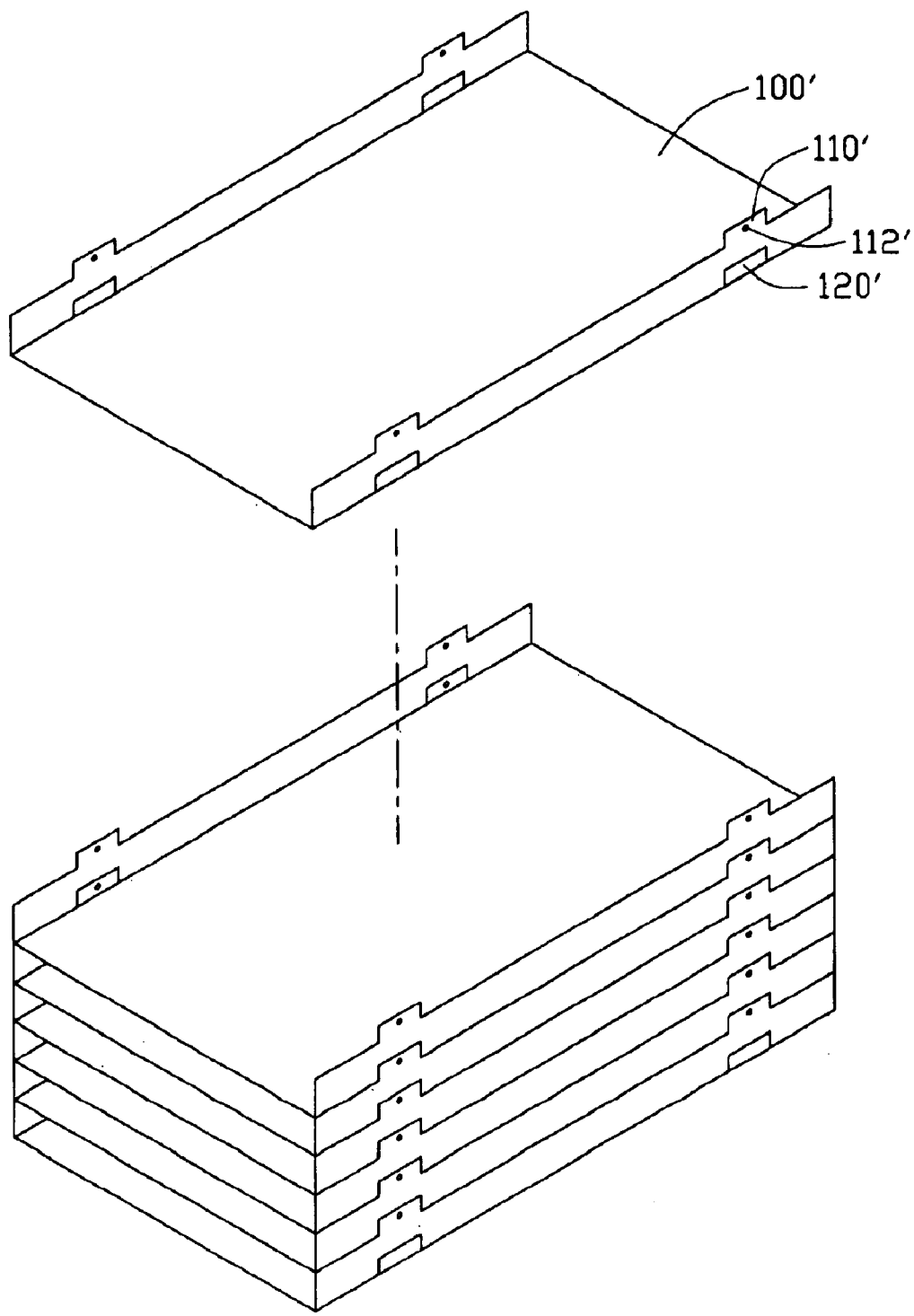
FIG. 5 is an isometric view of another conventional heat sink assembly.

Referring to FIGS. 1–3, a heat sink assembly 10 in accordance with the preferred embodiment of the present invention is used to dissipate heat from a heat-generating element such as a CPU (not shown). The heat sink assembly 10 comprises a heat-conductive base 20, and a plurality of fins 30 uprightly attached onto the base 20. The base 20 is intimately attached to an upper surface of the heat-generating element. Each fin 30 is formed by stamping a flat metal sheet.

Each fin 30 comprises a main body 31, and a flange 32 extending from a bottom end of the main body 31. Two lower abutting plates 34 extend upwardly from opposite sides of an outmost edge of the flange 32 respectively. A pair of first locking tabs 342 extends from outer sides of the lower abutting plates 34 respectively. The first locking tabs 342 are perpendicular to the lower abutting plates 34 prior to assembly of the heat sink assembly 10. The main body 31 defines two cutouts 36 at bottom portions of opposite sides thereof respectively, corresponding to the first locking tabs 342. Two upper abutting plates 34' are formed from opposite sides of a top edge of the main body 31 respectively, above the lower abutting plates 34 respectively. A pair of notches 38 is defined in opposite sides of a top portion of the main body 31 respectively. A second locking tab 40 extends perpendicularly from an outer side of each upper abutting plate 34', corresponding to the notch 38 of an adjacent main body 31.

In assembly, the fins 30 are sequentially placed on a flat working surface (not shown). The notches 38 of all the fins 30 are at a same level, and the cutouts 36 and the locking tabs 342 are all at a same level. The fins 30 are pressed to firmly abut against each other. The first locking tabs 342 of each fin 30 are extended into the cutouts 36 of an adjacent fin 30, and the second locking tabs 40 of each fin 30 are extended into the notches 38 of an adjacent fin 30. The first and second locking tabs 342, 40 are stamped inwardly to abut against the main body 31 of the adjacent fin 30. The fins 30 are thus connected together, and prevented from swinging back and forth and deforming a configuration of the combined fins 30. The flanges 32 of the fins 30 cooperatively form a surface for contacting the base 20. Then, the combined fins 30 are attached to the base 20 by means of welding or sintering.

In an alternative embodiment of the present invention, each second locking tab 40 can be a discrete retaining element, which clasps the upper abutting plate 34' of the fin 30 and the main body 31 of an adjacent fin 30 therebetween.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A heat sink assembly comprising:
   a heat-conductive base;
   a plurality of parallel fins attached onto the base, each of the fins comprising:
   an upright main body, upper and lower abutting plates respectively extending around upper and lower ends of the main body for abutting an adjacent fin, a pair of cutouts defined in opposite side edges of the main body, a pair of locking tabs formed at opposite side edges of the lower abutting plate and extending into corresponding cutouts of the adjacent fin and bent to abut against the main body of the adjacent fin; and
   retaining means each securing the upper abutting plate of a corresponding fin with the main body of an adjacent fin.

2. The heat sink assembly as described in claim 1, wherein a flange extends from a lower end of each of the fins, and the flanges of all the fins cooperatively form a surface contacting the base.

3. The heat sink assembly as described in claim 2, wherein the lower abutting plate extends upwardly from the flange.

4. The heat sink assembly as described in claim 1, wherein the upper and lower abutting plates of each of the fins firmly abut against the main body of the adjacent fin.

5. The heat sink assembly as described in claim 1, wherein each of the retaining means integrally extends from the upper abutting plate of the corresponding fin into a notch of the main body of the adjacent fin.

6. The heat sink assembly as described in claim 5, wherein each of the retaining means of the corresponding fin is bent to abut against the main body of the adjacent fin.

7. The heat sink assembly as described in claim 1, wherein a length of said retaining means is not more than a distance between the main body and the corresponding upper or lower abutting plate.

8. A heat sink assembly comprising:
   a heat-conductive base; and
   a plurality of parallel fins attached onto the base, each of the fins comprising a main body, upper and lower abutting plates respectively extending around upper and lower ends of the main body for abutting an adjacent fin, a plurality of cutouts defined in opposite side edges of the main body, a plurality of retaining tabs at opposite side edges of the upper and lower abutting plates, extending into corresponding cutouts of the adjacent fin, and the retaining tabs of at least one of the upper and lower abutting plates being further bent to abut against the main body of the adjacent fin.

9. The heat sink assembly as described in claim 8, wherein a flange extends from a lower end of each of the fins, and the flanges of all the fins cooperatively form a surface contacting the base.

10. The heat sink assembly as described in claim 9, wherein the lower abutting plate extends upwardly from the flange.

11. The heat sink assembly as described in claim 8, wherein the retaining tabs are integrally formed from the opposite side edges of the upper and lower abutting plates.

12. The heat sink assembly as described in claim 8, wherein a length of said retaining tab is not more than a distance between the main body and the corresponding upper or lower abutting plate.

13. A method of making a heat sink assembly, comprising steps of:
   providing a planar base;
   providing a plurality of fins mutually parallel to one another in a front-to-back direction on the base, each of said fins including a main body with two pairs of upper and lower abutting plates located around upper/lower ends and front/rear ends of the main body, the upper and lower abutting plates being parallel to the corresponding main body and abutting against the main body of the neighboring fin, a retaining tab integrally extending perpendicularly from an edge of each of said upper and lower abutting plates so that the main body of the neighboring fin is restricted between said retaining tabs without movement along said front-to-back direction; and
   bending said retaining tabs inwardly to contact in parallel to the main body of the neighboring fin and have said main body tightly sandwiched between the retaining tabs and the corresponding upper and lower abutting plate so as to prevent relative movement between neighboring fins along a lateral direction perpendicular to both said front-to-back direction and a vertical direction.

* * * * *